United States Patent [19]

Furrer

[11] Patent Number: 4,560,944

[45] Date of Patent: Dec. 24, 1985

[54] SWITCHING AMPLIFIER FOR DIGITAL POWER AMPLIFICATION

[75] Inventor: Andreas Furrer, Mönthal, Switzerland

[73] Assignee: BBC Brown, Boveri & Company Limited, Baden, Switzerland

[21] Appl. No.: 601,580

[22] Filed: Apr. 18, 1984

[30] Foreign Application Priority Data

May 10, 1983 [CH] Switzerland .......................... 2546/83

[51] Int. Cl.[4] .............................................. H03F 3/38
[52] U.S. Cl. ....................................... 330/10; 455/108
[58] Field of Search ............. 330/10, 297, 202, 207 A, 330/251; 455/108

[56] References Cited

U.S. PATENT DOCUMENTS

4,403,197 9/1983 Swanson ............................... 330/10

Primary Examiner—Eugene LaRoche
Assistant Examiner—G. Wan
Attorney, Agent, or Firm—Oblon, Fisher, Spivak, McClelland & Maier

[57] ABSTRACT

A power switching amplifier for digital power amplification of an analog input signal, wherein the input signal range is subdivided into a plurality of equal voltage steps and a number, corresponding to the number of voltage steps, of switching stages is driven and their direct-voltage sources are connected in series. The association between the voltage steps and the switching stages is variable, such that all switching stages are uniformly loaded and the switching frequencies are reduced.

9 Claims, 9 Drawing Figures

SWITCHING AMPLIFIER FOR DIGITAL POWER AMPLIFICATION

BACKGROUND OF THE INVENTION

1. Field of the Invention

This invention relates to a switching amplifier including a signal converter controlling plural series-connected switching stages, in which the total possible voltage range of the analog input signal is subdivided into a plurality of identical voltage steps and each voltage step is associated with a switching stage and in which the output voltages of switching stages are series-connected and summed in the exact number as correspond to the number of voltage steps within the respective amplitude of the analog input signal.

2. Description of the Prior Art

Such a switching amplifier as above noted is known, for example, from German Offenlegungsschrift No. 30 44 956. As an output signal, a time-related voltage is generated in the form of a staircase which, after smoothing in a low-pass filter, approximates the appropriately amplified analog input signal.

The amplifier described has already been successful particularly as a modulation amplifier in power transmitters and contributed to a significant improvement in the transmitter efficiency with respect to the electrical energy used.

An essential feature of the known amplifier is the fixed association between the voltage steps of the input signal range and the corresponding switching stages on the output side. Every time the amplitude of the input signal increases and reaches a certain voltage step, a certain switching stage associated with this voltage step is connected into the series circuit, that is to say its output voltage is also included into the summation occurring at the output. Every time the amplitude of the input signal, on the other hand, decreases and drops below this certain voltage step, the same switching stage is switched out of the series circuit so that its output voltage no longer contributes to the summation process. If, in contrast, the amplitude is always below or above, respectively, this voltage step, the associated switching stage remains constantly switched out or in.

Since in normal amplifying operations that occur, for example, in a broadcast transmitter, very small but also very large signal amplitudes occur relatively less frequently in the analog input signal than medium amplitudes because of a statistical distribution, switching processes occur relatively less frequently in the switching stages associated with those amplitude ranges. In other words, the switching stages responsible for small amplitudes are switched in for the predominant period of time and the switching stages responsible for high amplitudes are correspondingly switched out for the predominant period of time. In agreement with the unequal amplitude distribution, unequal operating conditions also exist therefore in the known amplifier for the different switching stages because of the rigid association of each switching stage with a corresponding amplitude.

To this unequal distribution of the switching processes, another very grave inequality is added in the reloading of the switching stages resulting from the principle of series connection. More particularly, the more switching stages are switched in series when the load at the output remains the same, the higher the voltage sum of the series-connected output voltages and thus also the current flowing through each switching stage. If thus in an already existing series circuit, one switching stage of many switching stages is switched in or out, a much higher current must be switched within this stage than in those stages which are located at the beginning of a series circuit. Accordingly, the current load on the switching elements in the switching stages is the greater the higher the input signal amplitude of the voltage steps associated therewith so that, simplified, in the fixed association according to the state of the art the upper switching stages are always subject to a high switching load whereas the lower switching stages carry a low switching load.

Finally, in the known amplifier very short switching-in or -out periods occur under certain circumstances for the individual switching stages, which periods require an unnecessarily high switching frequency for the switching elements used in the switching stages so that, for example, thyristors can be used in only a limited way because of the delay processes caused internally and by the external circuit elements. If, for example, a higher-frequency input signal, the amplitude of which varies only between two adjacent voltage steps, is amplified, the associated switching stages are switched in and out with the same higher frequency whereas other switching stages remain consistently switched in or out.

SUMMARY OF THE INVENTION

Accordingly, the objects of this invention are to provide a novel switching amplifier for digital power amplification of an analog input signal, which amplifier ensures a more uniform operation of the individual switching stages and in addition makes it possible to reduce the required switching frequencies in the switching stages.

These and other objects are achieved according to the invention by providing a novel switching amplifier including a signal converter and plural series-connected switching stages, wherein the signal converter divides the input signal range of an input signal into a number of voltage steps equal to the number of switching stages, and for each step change in amplitude of the input signal, a switching stage in the series circuit is either switched in or out, and a drive unit for driving the switching stages, wherein before each switching process, the association between voltage step and switching stage is redetermined.

By redetermining the association between voltage steps and switching stages before each switching process, the decisive advantage is obtained that the switching stages can be operated more uniformly independently of the type of analog input signal and of its amplitude distribution.

It is particularly advantageous for continuous monitoring of the operating condition of the switching stages and for determining the association between voltage step and switching stage before each switching process as determined by the respective operating condition because in this manner feedback between the operating condition and the switching stage control, which individually reacts to each switching stage, is possible.

In another preferred embodiment of the amplifier according to the invention, the time between two successive switching processes is measured for each switching stage and, for the respective switching process of switching a switching stage in or out, that switching stage is selected which has been switched out or in for the longest time since its last switching process. In this manner, especially the very short switching periods in the switching stages can be avoided.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
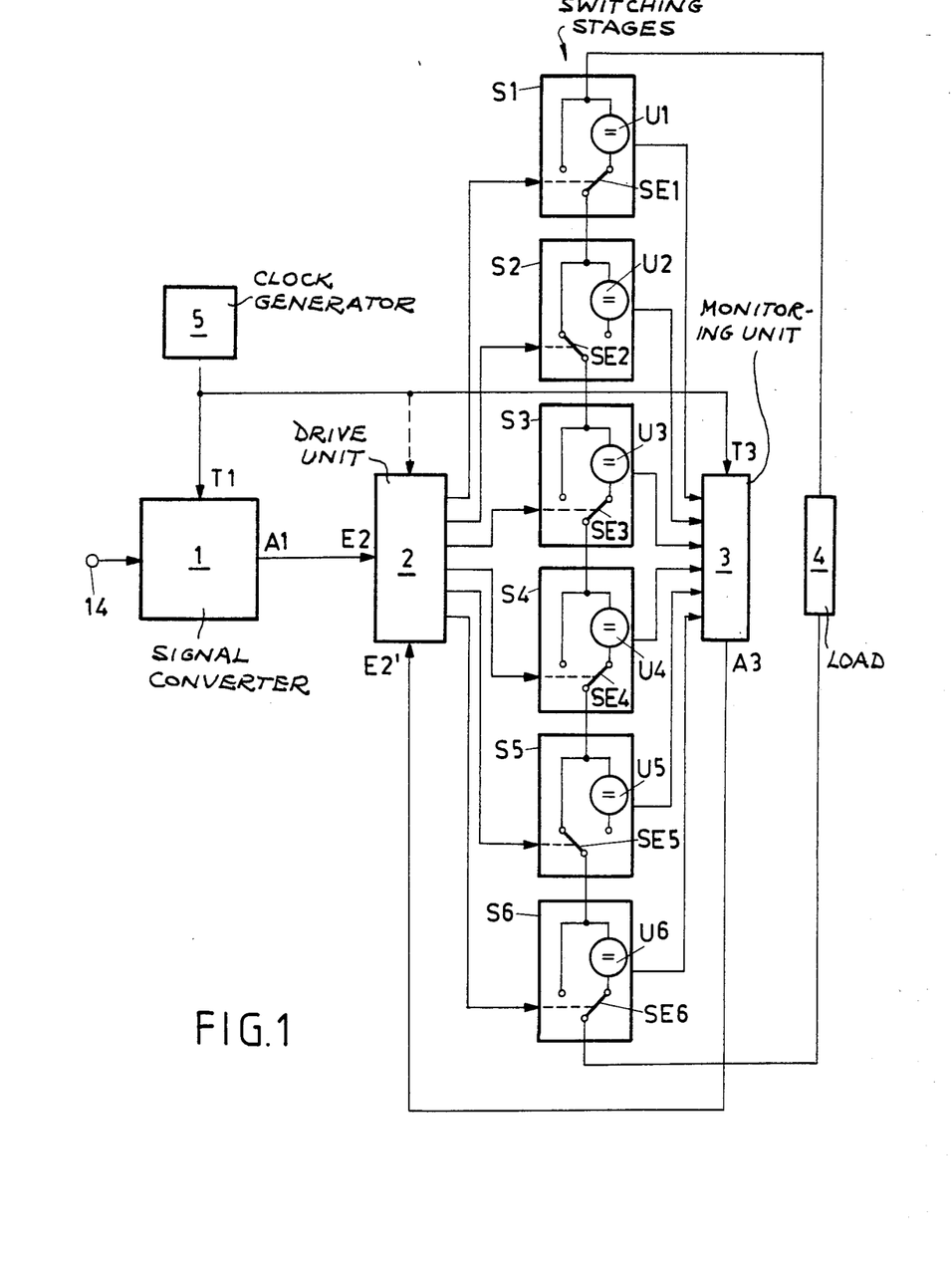
FIG. 1 is a block diagram of an embodiment of the switching amplifier according to the invention and an additional monitoring unit.

A block diagram of an embodiment of the switching amplifier according to the invention and an additional monitoring unit is represented. From an input 14, the analog input signal to be amplified reaches a signal converter 1. At an output A1, the signal converter 1 outputs control commands which are fed via an input E2 into a drive unit 2. From the drive unit 2, control lines run to a plurality of switching stages S1 . . . S6 of which in the present example only six are present for reasons of clarity. The switching stages S1 . . . S6 contain efficient direct-voltage sources U1 . . . U6 with essentially identical output voltage and corresponding switching elements SE1 . . . SE6 which, for example, are constructed as change-over switches and, together with the direct-voltage sources U1 . . . U6, are arranged in such a manner that the output voltages of the sources can be optionally connected in series.

In this case, from each of the switching stages S1 . . . S6 a monitoring line leads to a common monitoring unit 3 in which certain operating parameters of the switching stages S1 . . . S6 are monitored. Via an output A3 of the monitoring unit 3, control and address commands are output which, through an input E2', are fed back to the drive unit 2 so that a feedback loop is generated. The series circuit of the switching stages S1 . . . S6 is connected across a load 4 which, for example, can be constructed as the RF output stage of a broadcast transmitter and can additionally be provided with a low-pass filter for smoothing purposes. The variation with time of the events in the switching amplifier is suitably controlled and synchronized between the individual functional units by a common clock generator 5 which is connected via corresponding clock lines at least to the signal converter 1 and to the monitoring unit 3 and, if required, also to the drive unit 2.

Figure 5A:
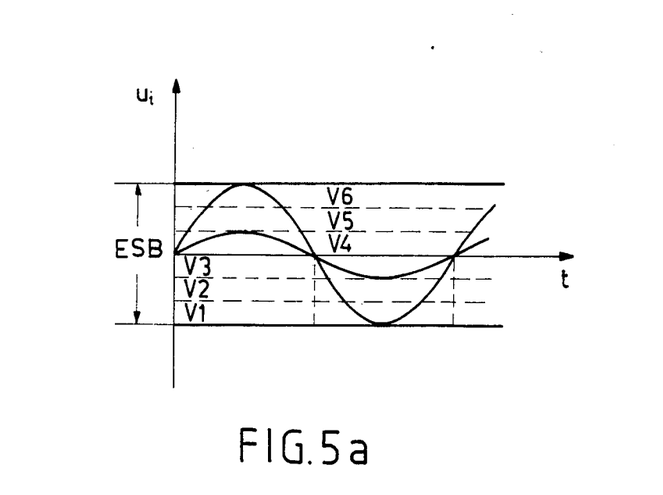
FIGS. 5a–e are graphs illustrating the association between voltage steps and switching stages in an illustrative embodiment of the invention for two different input signal amplitudes in comparison with the state of the art.

As indicated in FIG. 5a, the signal converter 1 subdivides the input signal range ESB, that is to say the range of maximum signal amplitude $u_i$, into a multitude of equal voltage steps V1 . . . V6. It periodically samples the instantaneous amplitude of the analog input signal with the clock frequency of the clock generator 5 and determines how many voltage steps are in each case contained in the amplitude value sampled. If the number of these voltage steps has increased by one with respect to the value determined in the preceding sampling process, a corresponding control command is output at the output A1 which leads to an additional switching stage being switched into the series circuit. If, in contrast, the number has decreased by one, analogously a control command is output which leads to one of the switching stages S1 . . . S6 being switched out of the series circuit. Which of the switching stages S1 . . . S6 is switched in or out depends on the control and address commands from the monitoring unit 3.

Figure 4:
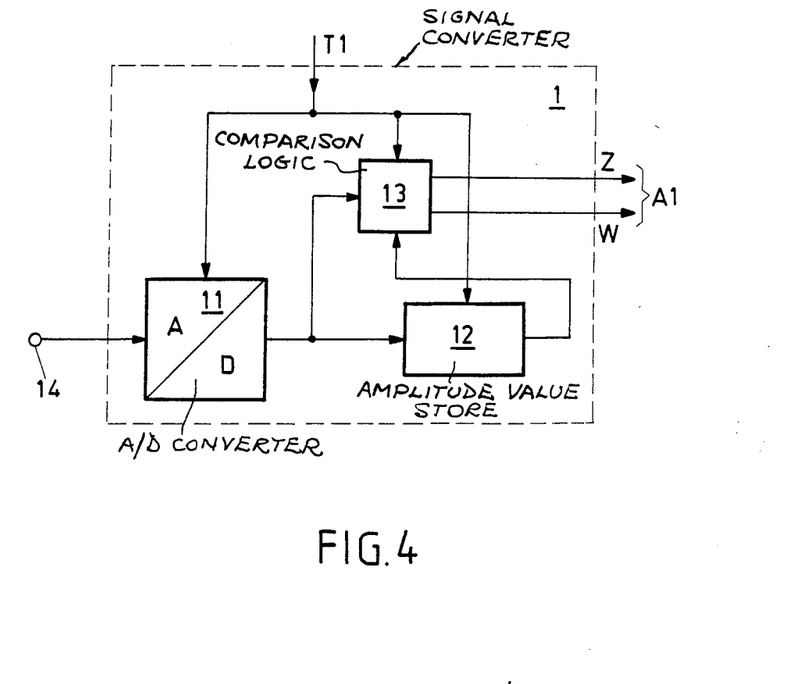
FIG. 4 is a block diagram of an illustrative embodiment for a signal converter from FIG. 1.

An illustrative embodiment of the signal converter 1 from FIG. 1 is shown in FIG. 4. Via input 14, the analog input signal is supplied to an analog/digital (A/D) converter 11 which is controlled through a clock input T1 by the clock signal of the clock generator 5 and, for example, samples the input signal every 10 μsec. The A/D converter 11 generates a digital value which corresponds to the signal amplitude and which is stored in an amplitude value store 12. Simultaneously with being stored in the amplitude value store 12, the value reaches the input of a comparison logic 13 which is also clocked via the clock input T1. Another input of the comparison logic 13 is supplied with the digital amplitude value originating from the preceding sampling process and which was stored in the amplitude value store 12 before the new value was stored there and is read out at the same time as the new value is read in.

In this manner, the amplitude value just sampled is compared in the comparison logic 13 with the respective previously sampled value in the form of the equivalent digital values. With an increase in amplitude, the comparison logic 13 outputs a control command via a connecting line Z and with a decrease in amplitude it outputs a control command via a disconnecting line W which both form the output A1.

In addition, it is also possible to take from the A/D converter 11 not the digital amplitude value originating from the preceding sampling process as reference value for the comparison logic 13 but the digital value corresponding to the number of switching stages actually switched into circuit. This prevents that any control errors occurring between the signal converter 1 and the switching stages S1 . . . S6 falsify the variation of the signal at the output of the switching amplifier without being corrected.

Figure 3:
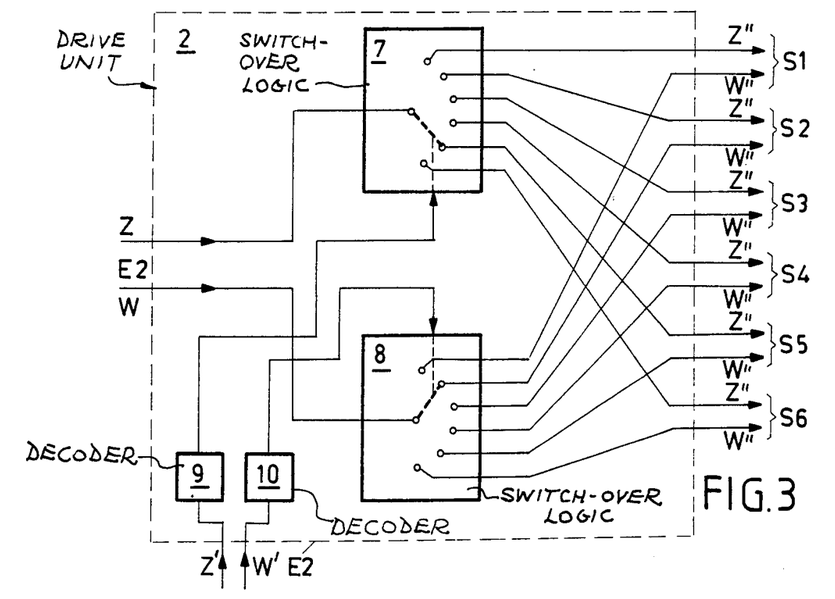
FIG. 3 is a schematic circuit diagram of an illustrative embodiment for a drive unit from FIG. 1.

The lines Z and W lead to the corresponding input E2 of the drive unit 2 the construction of which is shown in an illustrative embodiment in FIG. 3. Inside the drive unit 2, the connecting line Z ends in a switch-over logic 7 and the disconnecting line W in a similar switching-over logic 8. The two switch-over logic units 7 and 8 are driven by associated decoders 9 and 10 which via input E2' receive from the monitoring unit 3 an address information in coded form concerning the two switching stages to be switched in or out, respectively, as next stages. As soon as the incoming address information has been decoded in the driven decoder 9 or 10, this decoder activates the associated drive logic 7 or 8 which then establishes a connection between the connecting or disconnecting line Z or W, respectively, at the input and that connecting or disconnecting line at the output which leads to the switching stage associated with the processed address information.

Altogether, each switching stage S1 . . . S6 is connected to the drive unit 2 via a pair of lines consisting of a connecting line Z and a disconnecting line W via which either a control command for switching in or a control command for switching out can be given to the switching stage. If, for example, the switching stage S5 is not yet switched in and the switch-over logic 7 is just set in such a manner that the next switching-in command reaches this switching stage S5, this switching stage and its direct-voltage source U5 are included in the series circuit and the output voltage is increased by the appropriate value. In the monitoring unit 3, now, the operating data of all switching stages are utilized for selecting a new switching stage which has not been switched in, and the associated address information is transferred via the decoder 9 to the switch-over logic 7 which establishes a new association, corresponding to the address information, between its input and its output so that on arrival of the next switching-in command from the signal converter 1 the newly selected switching stage is switched in. An analog process occurs during the switching-out with the aid of decoder 10 in the switch-over logic 8.

Figure 2:
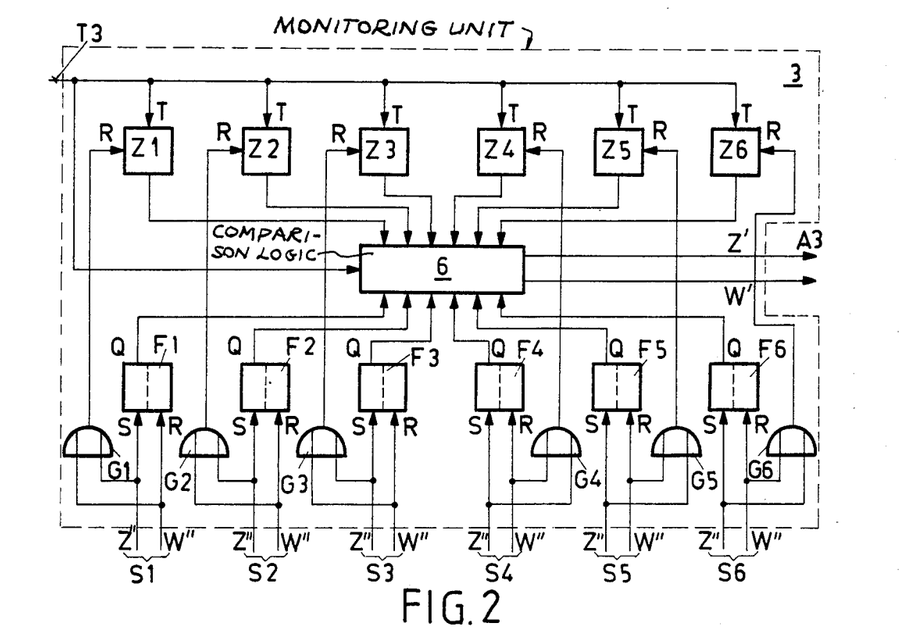
FIG. 2 is a circuit diagram of an illustrative embodiment for a monitoring unit from FIG. 1.

In detail, the internal configuration of the monitoring unit 3 depends on the manner in which the operating condition of the switching stages S1 ... S6 is to be monitored. According to a preferred illustrative embodiment of the process according to the invention, the time between two successive switching processes is measured for each switching stage and for the respective process of switching-in or switching-out that switching stage selected which has been switched out or in for the longest period since its last switching process. A circuit, suitable for this type of monitoring, for the monitoring unit 3 is shown in FIG. 2.

From the switching stages S1 ... S6, pairs of monitoring lines lead to the monitoring unit 3 of which each pair, in turn, comprises a connecting line Z" and a disconnecting line W"'. Each pair of monitoring lines is connected to the set input S or reset input R of a store F1 ... F6 which is constructed as bi-stable flip flop. The outputs Q of the stores F1 ... F6 are connected via lines to a corresponding number of inputs at a comparison logic 6. Each pair of monitoring lines is also connected via OR gates G1 ... G6 to the reset inputs R of a number of counters Z1 ... Z6 of which each is associated with one of the switching stages S1 ... S6. The counters Z1 ... Z6 count the clock pulses from the clock generator 5 which, via the clock input T3, reach the individual clock inputs T of the counters Z1 ... Z6. The respective count of the counters Z1 ... Z6 is supplied via lines to the comparison logic 6 where it is evaluated.

Operation of the monitoring unit 3 is next described. Every time one of these switching stages S1 ... S6 is switched in via a control command from the signal converter 1, for example via switch-over logic 7, a pulse reaches, via the connecting line Z of the associated pair of monitoring lines, the set input S of the corresponding store and sets its output Q to a logic "one". This indicates to the comparison logic 6 that the associated switching stage is switched in and, therefore, can only be switched out. Simultaneously, the pulse also reaches, via the OR gate, the reset input R of the appropriate counter and resets this to zero. For the counting of the clock pulses and the resetting with each switching process of the associated switching stage, the count of this counter is a measure of the time which has elapsed since the last switching process, here since the switching-in.

If the switching stage is switched out of the series circuit again by a control command via switch-over logic, a pulse is supplied, via the disconnecting line W"' of the monitoring lines, to the reset input R of the flip flop and the output Q is set to a logic "zero". This indicates to the comparison logic 6 that the switching stage connected is switched out and can only be switched in again when the opportunity arises. Simultaneously, this pulse also reaches, via the "OR" gate, the reset input R of the counter and again resets this to zero.

The count of the counters Z1 ... Z6 which is generally increased by one with each clock pulse, is, therefore, always a measure of the time which has elapsed at each switching stage since the last switching process, independently of whether the switching process has meant a switching in or a switching out of the stage. On the other hand, the outputs Q of the flip flops F1 ... F6 indicate which of the switching stages S1 ... S6 has just been switched in and which has just been switched out. From this division of the switching stages into two groups and the count information, the comparison logic 6 determines by comparison which one of the group of switching stages switched in has already been switched in for the longest period and, correspondingly, which one of the group of switching stages switched out has already been switched out for the longest period. The address information, that is to say the coded numbers of both switching stages, are transferred at the output A3 via separated connecting and disconnecting lines Z', W' to the decoders 9 and 10 in the drive unit 2.

The illustrative embodiments, described and explained with the aid of FIGS. 1-4, of the switching amplifier and its components can be modified in various ways in the sense of the invention by the average expert and matched to these special requirements. Thus it is possible in the illustrative embodiment of the monitoring unit 3 described in accordance with FIG. 2, among others, to omit monitoring lines from the switching stages S1 ... S6 to the monitoring unit 3 and to combine the monitoring unit 3 with the drive unit 2 into a common unit. The control commands for switching stages in or out respectively then reach the switching stages S1 ... S6 in parallel and simultaneously with the stores F1 ... F6 of the monitoring unit so that a feedback loop via the switching stages S1 ... S6 no longer exists.

In addition, it is also not absolutely necessary to construct all control lines within the switching amplifier as separate pairs of connecting and disconnecting lines Z and W. Thus, for example, the control commands for a switching stage can be transmitted on a common line, especially a light-conducting fiber, in which arrangement the connecting or disconnecting command occurs in each case as a signal with a different code, in the form of a logical "0" and "1" or in the form of positive and negative pulse edges.

Figure 5B:
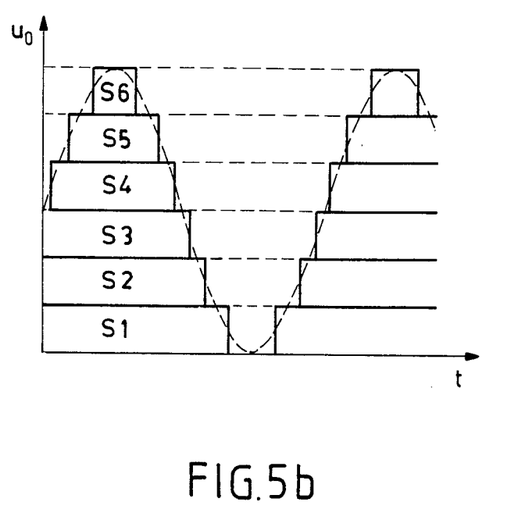
Figure 5C:
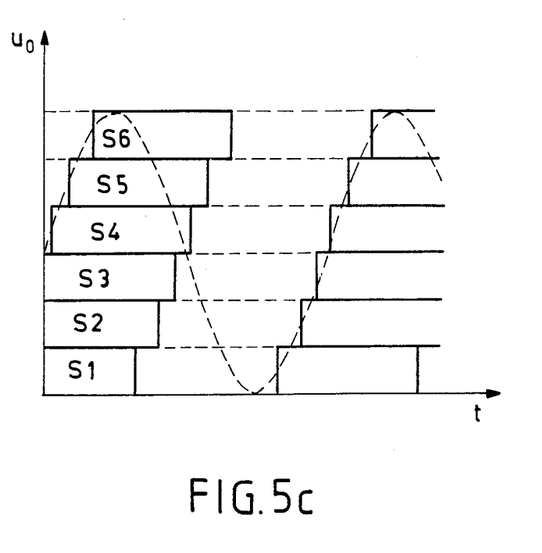
Figure 5D:
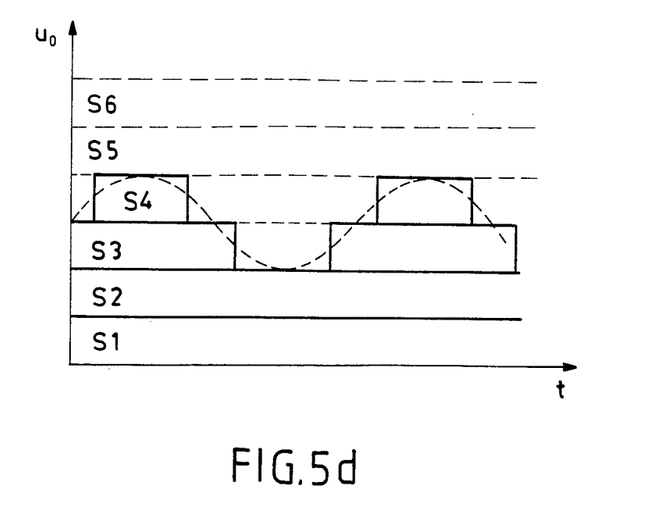
Figure 5E:
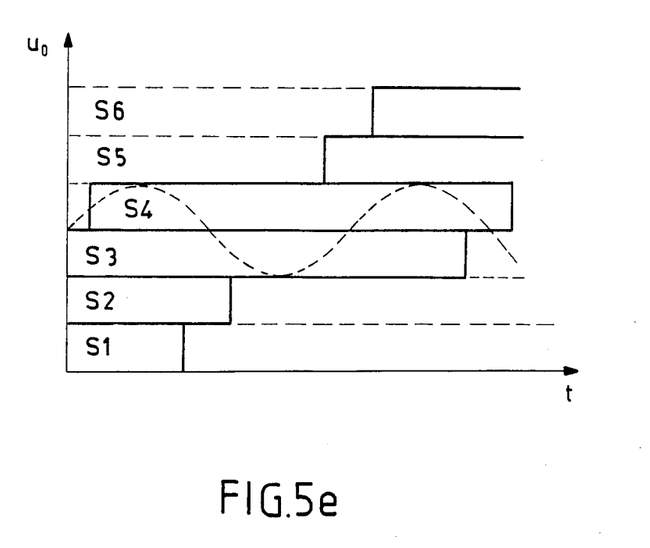

The association, resulting from the illustrative embodiments described, between the voltage steps V1 ... V6 of the input signal range ESB and the switching stages S1 ... S6 is shown in FIGS. 5a, 5c and 5e whilst the FIGS. 5b and 5d describe an association in accordance with the state of the art for comparison purposes. FIG. 5a shows the variation with time $u_i$ (t) of two sinusoidal signal amplitudes $u_i$ of which one covers the whole input signal range ESB whereas the other one amounts to only about a third part of this amplitude. In the application of the amplifier for modulating a power transmitter, this corresponds to correspondingly different modulation percentages.

In agreement with the number of switching stages S1 ... S6, the input signal range ESB is subdivided into the six voltage steps V1 ... V6. If firstly the greater of the two sinusoidal signals is considered, it can be immediately seen that the amplitude $u_i$, starting from zero, successively passes through the voltage steps V4, V5 and V6 up to maximum and then in the reverse order passes through V6 to V1 successively to minimum or negative maximum, respectively. Analogously, in the amplifier according to the state of the art (FIG. 5b), firstly the switching stages S4, S5 and S6 are switched in and subsequently S6 to S1 are successively switched out in the reverse order. From the representation in FIG. 5b it can be immediately seen that with this fixed association, the initially mentioned non-uniform operating conditions occur for the individual switching stages S1 . . . S6, i.e., whereas the switching stages S1 and S6 are predominantly switched in or out respectively, and thus have very short switching-out or switching-in phases respectively, the two phases are of approximately equal length with stages S4 and S3.

A completely different operating characteristic is obtained in accordance with FIG. 5c for the variable association between voltage steps V1 . . . V6 and switching stages S1 . . . S6 such as is used with the amplifier according to the invention and has been explained in detail with the aid of the illustrative embodiments. Although here, too, as with the state of the art, initially the switching stages S4, S5 and S6 are switched in successively with increasing input signal amplitude $u_i$, the essential differences as compared with the known amplifier become clear as soon as the amplitude $u_i$ drops and tends towards its minimum value: it is not switching stage S6 which is switched out again as the first stage but the switching stage S1 because at this time this switching stage has already been switched in for the longest period. The same applies to switching stages S2, S3 . . . , S6 which are successively switched out. Whereas, therefore, in this special example the sequence of connecting the switching stages S1 . . . S6 agrees with that in the known amplifier by arbitrary determination, during the switching-out per force the exactly opposite sequence is obtained.

Summing the output voltages of the connected switching stages and their direct-voltage sources to an output voltage amplitude $u_o$ leads, as can be easily checked, in both cases (FIGS. 5a and 5b) to the same staircase voltage which, after a smoothing process, corresponds to the amplified input signal. However, the operational characteristics of the switching stages S1 . . . S6 are completely different. In contrast to the non-uniform operating conditions mentioned and caused by switching phases of different length as expressed in FIG. 5b, according to FIG. 5c the switching stages S1 . . . S6 are switched in a largely uniform manner, the switching phases being approximately of equal length for each switching stage.

The effects and advantages of the amplifier according to the invention become even clearer if, instead of the maximum input signal amplitude, an input signal with smaller amplitude is considered such as occurs, for example in a broadcast transmitter, much more frequently because of the amplitude distribution. Such a signal, which varies only between two voltage steps V3 and V4, is also shown in FIG. 5a. According to the state of the art, the switching stages S1 . . . S6 are driven in the manner shown in FIG. 5d: the switching stages S1 and S2 are in this case continuously switched in and the switching stages S5 and S6 are correspondingly continuously switched out. All four said stages, therefore, do not cause any switching losses. The total switching loads are exclusively carried by the two switching stages S3 and S4 which are rigidly associated with the voltage steps V3 and V4.

In contrast, quite different characteristics are shown by the drive according to FIG. 5e in the variable association between the voltage steps V1 . . . V6 and the switching stages S1 . . . S6, i.e., all switching stages are uniformly switched in or out, respectively, and the switching loads are correspondingly distributed to all switching stages. A further advantage also becomes apparent in comparison with FIG. 5d. Whereas there the switching frequency of the stages S3 and S4 is equal to the frequency of the output signal, in FIG. 5e the switching frequency is reduced to a third of this signal frequency and distributed to all switching stages S1 . . . S6 because the input signal amplitude also amounts only to about one third of the output signal range ESB.

This relation follows the general connection that, with decreasing amplitude of the input signal, the switching frequency of the individual switching stages also decreases in comparison with the signal frequency.

Although, therefore, the total number of switching processes in all switching stages in combination remains unaltered in comparison with the known amplifier, the switching processes are in each case very uniformly distributed to all switching stages which generally leads to a reduction in switching frequencies in the individual stages and results in a more uniform loading of all stages with respect to the currents to be switched.

In particular, the type of drive described is of advantage if in these switching stages thyristors and especially the known gate-turn-off (GTO) thyristors are to be used as switching elements. Because of their turn-off time and the effects of external circuit elements, the thyristors are restricted in their application to the extent that between a switching-in and switching-out process a period of time must elapse which, in comparison to power transistors, is comparatively long in order to ensure proper functioning. This time is significantly extended in the mean by the process according to the invention so that a new field of application is opened especially for thyristors.

Obviously, numerous modifications and variations of the present invention are possible in light of the above teachings. It is therefore to be understood that within the scope of the appended claims, the invention may be practiced otherwise than as specifically described herein.

LIST OF DESIGNATIONS

1: Signal converter
2: Drive unit
3: Monitoring unit
4: Load
5: Clock generator
6, 13: Comparison logic
7, 8: Switch-over logic
9, 10: Decoder
11: A/D converter
12: Amplitude-value store
14, E2, E2': Input
A1, A3: Output
G1 . . . G6: OR gate
ESB: Input signal range
F1 . . . F6: Store (flip flop)
S1 . . . S6: Switching stage
SE1 . . . SE6: Switching element
U1 . . . U6: Direct-voltage source
$u_i$: Input-signal amplitude $u_0$: Ouput-voltage amplitude
T, T1, T3: Clock input
R: Reset input
S: Set input
Q: Store output
Z1 ... Z6: Counter
Z: Connecting line
W: Disconnecting line
V1 ... V6: Voltage steps

I claim:

1. A switching amplifier for digital power amplification of an analog input signal, comprising:
    a signal converter;
    a plurality of series-connected switching stages;
    said signal converter comprising means for subdividing a predetermined input signal range of said input signal into a number of equal voltage steps corresponding to the number of said switching stages, means for continuously sampling the analog input signal via an input and generating control signals indicating that with a change in the amplitude of the input signal by one voltage step, one switching stage in the series circuit is to be switched in or out;
    a drive unit receiving said control signals for producing control commands for driving the switching stages based on said control signals generated by the signal converter;
    wherein before each switching process, an association between said voltage steps and said switching stages is redetermined; and
    a monitoring unit for monitoring a predetermined operating condition of each of the switching stages and for controlling said association between voltage steps and switching stages in the drive unit in accordance with a determination of the predetermined operating conditions of each of said switching stages, said monitoring unit comprising:
    a time-measuring device for measuring the time between two successive switching processes of each switching stage;
    stores for storing the respective switching conditions; and
    a comparison logic circuit connected to the time-measuring device and stores for comparing the time between two successive switching processes for each of said switching stages and, for the next switching process, selecting a switching stage for which switching is suitable according to its switching condition and which has not changed its switching condition for the longest time period.

2. A switching amplifier according to claim 1, comprising:
    a clock generator connected to the signal converter and the monitoring unit; and
    the time-measuring device comprising digital counters having clock inputs and receiving counting pulses from the clock generator via said clock inputs.

3. A switching amplifier according to claim 2, wherein the stores comprise bi-stable flip flops which are set or cleared synchronously with the control commands from the drive unit.

4. A switching amplifier according to claim 1, wherein each switching stage comprises:
    a direct-voltage source, and
    a switching element,
    wherein the direct-voltage source and the switching element are arranged such that the direct-voltage source can be optionally bridged or connected in series with the direct-voltage sources of other switching stages in a series circuit of the switching stages.

5. A switching amplifier according to claim 4, wherein the switching stages comprise thyristors as switching elements.

6. A switching amplifier according to claim 1, wherein the signal converter comprises:
    an analog/digital converter,
    an amplitude value store connected to said analog/digital converter for storing successive digital amplitude values produced by said analog/digital converter, and
    a comparison logic for comparing the amplitude value stored in the amplitude-value store with a next successive digital amplitude value and at an output emitting a switching-in command or a switching-out command to the drive unit in accordance with the result of the comparison.

7. A switching amplifier for digital power amplification of an analog input signal, comprising:
    plural series connected switching stages driven independently of one another and having an output providing an amplified signal that has essentially the same wave shape as the input signal, each switching stage comprising a dc voltage source and a switching element connected to the dc voltage source, each said switching element being selectively operable either to connect the respective dc voltage source in series with the other switching stages or to disconnect and bypass the respective dc source in the series connection of said switching stages;
    a signal converter, having an input side to which the analog input signal is fed, for producing at an output side a control signal for switching on or off selected of said switching stages as a function of the respective amplitude of the input signal, wherein said input signal has an input signal range divided into plural identical voltage steps respectively corresponding to the number of switching stages;
    a drive unit having an input connected to the signal converter and an output connected to the switching stages, comprising at least one switch-over logic circuit which, in case of a switching-on control signal, sends a switching-on command to that switching stage which has been switched off longest and in case of a switching-off control signal sends a switching-off command to that switching stage that has been switched on longest.

8. A process for amplification of an analog low-frequency signal using a switching amplifier including plural switching stages that can be driven independently of one another and which can be switched together in series, comprising:
    dividing a permissible input voltage of the amplifier into plural identical voltage steps corresponding to the number of switching stages,
    determining as a function of the instantaneous value of the amplitude of the low-frequency signal, the number of voltage steps whose sum is equal to, or less than, one voltage step smaller than said instantaneous value;
    switching on as a function of an increase of the instantaneous value of the amplitude of the low-frequency signal that switching stage which has been switched off longest; and switching off as a function of a reduction of the instantaneous value of the amplitude of the low-frequency signal that switching stage which has been switched on longest.

9. A process as in claim 8, wherein the instantaneous value of the amplitude of the low-frequency signal is detected at preset intervals.

* * * * *

UNITED STATES PATENT AND TRADEMARK OFFICE
CERTIFICATE OF CORRECTION

PATENT NO. : 4,560,944
DATED : December 24, 1985
INVENTOR(S) : Andreas FURRER

It is certified that error appears in the above-indentified patent and that said Letters Patent is hereby corrected as shown below:

Claim 8, column 10, line 63, change line to read --less than one voltage step smaller than, said instan--.

Signed and Sealed this

Thirteenth Day of December, 1994

*Attest:*

BRUCE LEHMAN

*Attesting Officer*     *Commissioner of Patents and Trademarks*